United States Patent [19]

Kamitakahara

[11] Patent Number: 5,147,763
[45] Date of Patent: Sep. 15, 1992

[54] PROCESS FOR PRODUCING MOLDING STAMPER FOR DATA RECORDING MEDIUM SUBSTRATE

[75] Inventor: Hirofumi Kamitakahara, Yokohama, Japan

[73] Assignee: Canon Kabushiki Kaisha, Tokyo, Japan

[21] Appl. No.: 815,610

[22] Filed: Jan. 7, 1992

Related U.S. Application Data

[63] Continuation of Ser. No. 422,639, Oct. 17, 1989.

[30] Foreign Application Priority Data

Oct. 19, 1988 [JP] Japan .................. 63-264691

[51] Int. Cl.$^5$ .................. G03C 5/00; G11B 3/72
[52] U.S. Cl. .................. 430/320; 430/323; 430/397; 430/5
[58] Field of Search ............... 430/320, 321, 322, 397, 430/5

[56] References Cited

U.S. PATENT DOCUMENTS 4,778,747 12/1988 Ohta et al. .................. 430/321
4,888,266 12/1989 Lacotte et al. .................. 430/141

FOREIGN PATENT DOCUMENTS 86721 7/1981 Japan .
87203 7/1981 Japan .
236049 10/1986 Japan .

Primary Examiner—Marion E. McCamish
Assistant Examiner—S. Rosasco
Attorney, Agent, or Firm—Fitzpatrick, Cella, Harper & Scinto

[57] ABSTRACT

A process for producing a stamper having a roller form is disclosed. The process includes the steps of: forming a layer of a photoresist on a stamper substrate having a roller form; causing a flexible exposure mask having a predetermined pattern to substantially contact the roller stamper substrate and exposing the roller stamper substrate to light by the medium of the exposure mask; subjecting the photoresist layer to development thereby to form on the stamper substrate a pattern of the photoresist corresponding to the pattern of the exposure mask; and forming on the stamper substrate an unevenness pattern corresponding to the pattern of the photoresist.

13 Claims, 5 Drawing Sheets

PROCESS FOR PRODUCING MOLDING STAMPER FOR DATA RECORDING MEDIUM SUBSTRATE

This application is a continuation of prior application Ser. No. 07/422,639 filed Oct. 17, 1989, now abandoned.

FIELD OF THE INVENTION AND RELATED ART

The present invention relates to a process for producing a roller-type stamper for molding a data (or information) recording medium substrate, which is capable of successively forming an unevenness pre-format on the data recording medium substrate, and a process for producing a data recording medium substrate having an unevenness pre-format by use of the roller-type stamper.

In data recording media, particularly in those wherein recording and/or reproduction is effected by using a laser beam, for example, a predetermined unevenness pattern (hereinafter, referred to as a "pre-format") such as an address pit and a tracking groove for guiding a laser beam for recording and/or reproduction is formed on the surface thereof on which data may be recorded. In order to form a groove in the substrate for such a data recording medium, there have been used the injection molding process, compression molding process, so-called "2P" process, casting (or cast molding) process, etc.

In these processes, stampers in the form of a flat plate have been used. In the production process for such a stamper, a photoresist film formed on a glass plate by coating is provided with a laser beam, or exposed to light by the medium of a predetermined photomask and then developed, thereby to form a patterned photoresist film, and the resultant pattern as a master is then subjected to nickel-electroforming a plurality of times to obtain an electroformed die (or mold) to which a prescribed pattern has been transferred. The thus obtained electroformed die has been used as a stamper.

In addition, Japanese Laid-Open Patent Application (JP-A, KOKAI) No. 236049/1986 discloses a glass master as a stamper for shaping a disk, wherein a signal corresponding to a predetermined pre-format pattern is directly recorded.

However, a system wherein the tracking groove of a data recording medium is shaped by using the above-mentioned conventional flat plate-type stamper as a molding die is disadvantageous in a production process aiming at reducing the cost.

For example, it is difficult to use the flat plate-type stamper in a continuous process for forming a tracking groove which includes serial or successive patterns.

In order to solve such a problem, Japanese Laid-Open Patent Application Nos. 86721/1981 and 87203/1981 disclose a process for mass-producing data recording disks at a low cost, wherein a pre-format pattern corresponding to a predetermined signal is successively formed on sheets by using a molding roller. The molding roller to be used in the above-mentioned production process has been formed by winding a thin sheet-like molding die about a roller, or by directly forming an unevenness pattern on the peripheral surface of a roller-type stamper substrate.

The latter method wherein an unevenness pre-format pattern is directly formed on the peripheral surface of a roller-type stamper substrate can provide a molding stamper having a simpler structure and a higher reliability, as compared with the former method wherein a thin sheet like stamper is wound about the peripheral surface of a roller type stamper substrate. This is because the latter method may omit means for fixing the sheet-type stamper to the roller.

In the prior art, in order to directly form an unevenness pre-format pattern (i.e., an unevenness pattern corresponding to the pre-format of a data recording medium) on the peripheral surface of a roller-type stamper substrate, the peripheral surface of the roller-type molding die substrate is ground to a mirror surface, a photoresist is applied to the resultant surface and exposed to a laser beam to be patterned, and the resultant product is subjected to etching, whereby an unevenness pre-format pattern is formed on the peripheral surface.

However, such a process has the following disadvantages:

(1) Since a laser beam is used in the exposure step, the laser head (i.e., a laser light-emitting device) must be moved three-dimensionally for the purpose of the exposure. Particularly, it is difficult to accurately or precisely draw a tracking groove in the form of a spiral or concentric circles for a data recording medium such as a opto-magnetic disk on an optical disk.

(2) Since the laser beam exposure device which is capable of precisely drawing a tracking groove for a data recording medium by using the above-mentioned laser beam exposure is very expensive, the production cost of the roller-type stamper also becomes great.

(3) The period of time for drawing the tracking groove for a data recording medium by use of the above-mentioned laser beam exposure becomes at least one to two hours, whereby the production of the data recording medium only achieves a low efficiency.

SUMMARY OF THE INVENTION

An object of the present invention is, in view of the above-mentioned problems encountered in the prior art, to provide a process for simply and inexpensively producing a stamper having a roller form which comprises a roller-type die substrate having a precise unevenness pre-format pattern on its peripheral surface.

Another object of the present invention is to provide a process for producing a data recording medium substrate by using a roller-type stamper which comprises a roller-type die substrate having a precise unevenness pre-format pattern on its peripheral surface, and is capable of being produced simply and inexpensively.

According to the present invention, there is provided a process for producing a stamper having a roller form to be used for forming a predetermined pattern on a data recording medium substrate, the process comprising the steps of:

forming a layer of a photoresist on a stamper substrate having a roller form;

causing a flexible exposure mask having a predetermined pattern to substantially contact the roller stamper substrate having thereon the photoresist layer, and exposing the roller stamper substrate to light by the medium of the exposure mask;

subjecting the photoresist layer to development thereby to form on the stamper substrate a pattern of the photoresist corresponding to the pattern of the exposure mask; and forming on the stamper substrate an unevenness pattern corresponding to the pattern of the photoresist.

The present invention also provides a process for producing a data recording medium comprising a step of transferring a predetermined unevenness pattern of a stamper having a roller form to a substrate sheet, the stamper being formed by a process comprising the steps of:

forming a layer of a photoresist on a stamper substrate having a roller form;

causing a flexible exposure mask having a predetermined pattern to contact the roller stamper substrate having thereon the photoresist layer, and exposing the roller stamper substrate to light by the medium of the exposure mask;

subjecting the photoresist layer to development thereby to form on the stamper substrate a pattern of the photoresist corresponding to the pattern of the exposure mask; and forming on the stamper substrate an unevenness pattern corresponding to the pattern of the photoresist.

According to the above-mentioned production process for a stamper according to the present invention, the exposure for patterning may be conducted in a short period of time, and a precise pattern may easily be transferred, whereby a data recording medium substrate is provided simply and inexpensively.

According to my investigation, the exposure mask which has conventionally been used for producing a flat plate-type stamper has a flat-plate form and a high rigidity. Accordingly, it is considered that even if such a conventional mask is intended to be used for directly forming a pre-format pattern on a roller-type stamper, the mask does not sufficiently contact the roller-type stamper, whereby an unevenness pre-format pattern having high precision is not formed.

These and other objects, features and advantages of the present invention will become more apparent upon a consideration of the following description of the preferred embodiments of the present invention taken in conjunction with the accompanying drawings.

DETAILED DESCRIPTION OF THE INVENTION

Hereinbelow, the present invention is specifically described with reference to the accompanying drawings.

Figure 1:
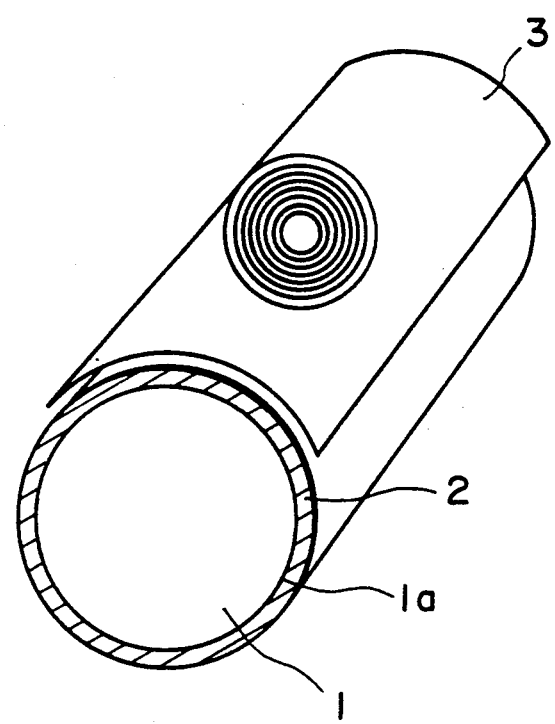
FIG. 1 is a schematic perspective view showing an embodiment of the exposure step in a process for producing a roller-type molding stamper for a data recording medium substrate according to the present invention, wherein a flexible exposure mask is used.

FIG. 1 is a schematic perspective view showing an embodiment of the production process for a stamper having a roller form (hereinafter, referred to as a "roller stamper") for molding a data recording medium substrate according to the present invention. Referring to FIG. 1, a photoresist layer 2 is disposed on the peripheral surface 1a of a roller-type stamper substrate 1, on which a pre-format pattern is to be formed. In FIG. 1, reference numeral 3 denotes a flexible exposure mask (or photomask).

In the present invention, the flexible exposure mask may preferably have a flexibility such that it may be fixed to (or disposed on) the peripheral surface of a cylindrical roller having a diameter of 500 mm (more preferably 200 mm, most preferably 50 mm) at 25° C., while substantially retaining a pattern formed thereon (or therein). Between the flexible exposure mask and roller used herein, there may be a maximum clearance of 0.1-5 microns (preferably 0.1-1 micron, more preferably 0.1-0.5 micron). Accordingly, the flexible exposure mask used in the present invention may also comprise a material having a plasticity.

FIGS. 2A to 2F and 3A to 3F show two embodiments of the production process for a flexible exposure mask. In these Figures, reference numeral 6 denotes a substrate having a high transmittance with respect to light such as ultraviolet light, numeral 4 denotes a film showing a high reflectivity with respect to light such as ultraviolet light to be used for exposure, and numeral 5 denotes a photoresist (layer) or a pattern of the photoresist.

The substrate for the flexible exposure mask to be used in the present invention may comprise any material as long as it can effectively transmit light such as ultraviolet light to be used for the exposure of a photoresist; is optically isotropic and does not have striae or cords; and can provide predetermined flexibility, flatness and surface roughness. In the present invention, such a material may preferably have a flatness (JIS B 7430 (Optical flat)) of ±10 microns or smaller, and/or a surface roughness (JIS B 0601) of ±30 Å or smaller.

The material for the flexible exposure mask substrate may for example include glass, ceramic, etc. Among these, quartz glass (or silica glass) may preferably be used. The flexible exposure mask substrate may preferably have a thickness of 0.5 mm or smaller, more preferably 0.03-0.3 mm. When quartz glass is used as the flexible exposure mask substrate, it is possible that both sides of the substrate material are ground with cerium oxide so as to provide a thickness in the above-mentioned range, whereby desired flexibility, flatness and surface precision may be obtained.

Figure 7A:
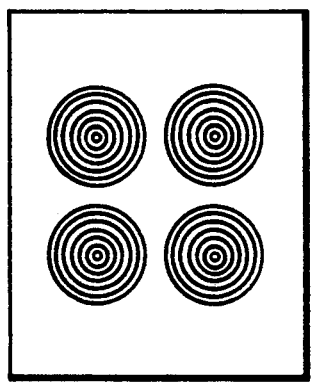
Figure 7B:
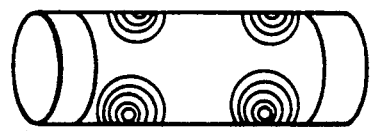

The size or dimension of the flexible exposure mask substrate is not particularly restricted, as long as the substrate can be subjected to grinding. When a large substrate is used, it is possible to obtain an exposure mask having plural pre-format patterns as shown in a plan view of FIG. 7A or a perspective view of FIG. 7B. When such an exposure mask is used for preparing a roller stamper, the resultant roller stamper may have plural unevenness pre-format patterns on its peripheral surface, and such a stamper may provide a higher productivity.

Figure 2A:
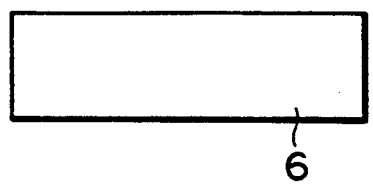
FIGS. 2A to 2F are schematic sectional views showing an embodiment of the process for producing a flexible exposure mask usable in the present invention.
Figure 2B:
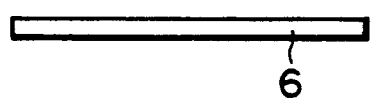

FIG. 2A shows a substrate material 6 before grinding and FIG. 2B shows the substrate material 6 after the grinding.

Figure 2C:
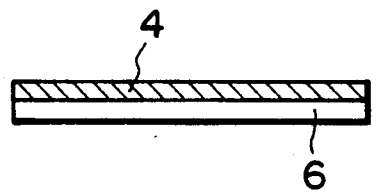
Figure 2D:
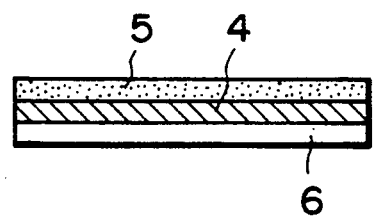
Figure 2E:
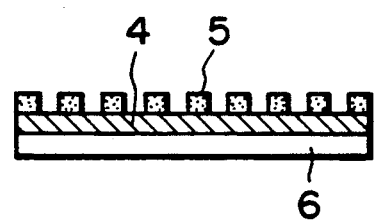
Figure 2F:
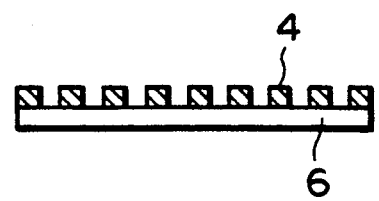

Then, a film (or layer) 4 for forming a pattern is formed on the substrate 6 as shown in FIG. 2C, and thereafter, is subjected to an ordinary photolithographic process to obtain a flexible exposure mask as shown in FIG. 2F. More specifically, a photoresist is applied onto the pattern-forming film 4 to form thereon a photoresist layer 5, as shown in FIG. 2D, the resultant product is then exposed to light by the medium of a mask (not shown) having a predetermined pattern corresponding to an unevenness pre-format pattern to be formed on a data recording medium substrate, and then developed (i.e., the photoresist film 5 as shown in FIG. 2D is subjected to patterning), thereby to obtain a laminate of the substrate 6 and the pattern-forming film 4 on which a pattern of the photoresist 5 is formed, as shown in FIG. 2E. The thus obtained laminate is then subjected to etching (and removal of the photoresist pattern 5 as desired), thereby to obtain an exposure mask comprising a transparent flexible substrate 6 and a predetermined pattern of the pattern-forming film 4, as shown in FIG. 2F.

The material used for the pattern-forming film 4 may preferably be one which does not substantially transmit light which is supplied to a photoresist layer to be formed on the surface of a roller stamper substrate in a subsequent step. Such a material may for example be Cr or Ni having a low reflectivity, or a dielectric multi-layer film. The dielectric multi-layer film may comprise a laminate wherein a film of a substance having a high refractive index such as $HfO_2$, $TiO_2$, $ZrO_2$, ZnS, $CeO_2$ and $Ta_2O_5$, and a film of a substance showing a low refractive index such as $MgF_2$, $SiO_2$, $Al_2O_3$, LiF and $CaF_2$ are alternately disposed. Such a multi-layer film may preferably include at least three layers.

The pattern-forming film 4 may preferably have a thickness of 500 to 1200 Å, more preferably 800 to 1000 Å, in view of the flexibility of the exposure mask and the masking effect thereof on the light to be supplied thereto.

Figure 3A:
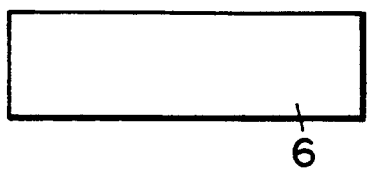
FIGS. 3A to 3F are schematic sectional views showing another embodiment of the process for producing a flexible exposure mask usable in the present invention.
Figure 3B:
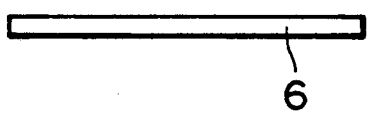
Figure 3C:
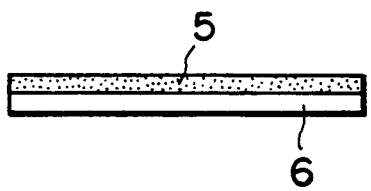
Figure 3D:
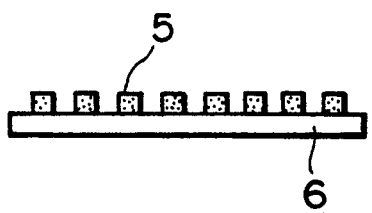
Figure 3E:
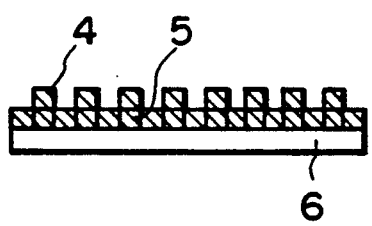
Figure 3F:
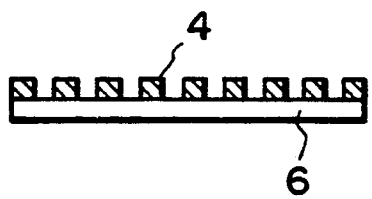

Alternatively, as shown in FIGS. 3A to 3F, a photoresist may be applied onto a ground substrate 6 (FIG. 3B), which has been obtained by grinding a substrate 6 as shown in FIG. 3A, to form thereon a photoresist layer 5 (FIG. 2C) and then the resultant photoresist layer 5 is subjected to patterning to form a pattern of the photoresist 5 on the substrate 6 (FIG. 3D), prior to the formation of a pattern-forming film 4. Thereafter, a pattern-forming film 4 is formed on the substrate 6 as shown in FIG. 3E, and then the photoresist 5 may be removed together with the corresponding portion of the pattern-forming film 4, whereby a predetermined pattern of the pattern-forming film 4 is formed on the substrate 6, as shown in FIG. 3F.

Then, referring to FIG. 1, a photoresist may be applied onto the peripheral surface 1a of a roller stamper substrate 1 to form thereon a layer 2 of the photoresist, the above-mentioned flexible exposure mask 3 is fixed to (or firmly disposed on or above) the roller stamper substrate 1, and thereafter the roller stamper substrate 1 is subjected to exposure, development and etching, whereby a roller stamper having an unevenness pre-format pattern is obtained. There can be a clearance or spacing of about 0.1 to 5 microns between the exposure mask 3 and the roller stamper substrate 1.

The exposure mask 3 may be fixed to the roller stamper substrate 1 by means of an adhesive, an adhesive tape, etc., or may be disposed above the roller stamper substrate 1 by using a jig or fixture (not shown).

More specifically, in the latter case, a frame may be formed so that it has a semicircular shape or cross section and has a curvature which substantially corresponds to the outside diameter of the roller stamper substrate 1, and the frame may be supported by four columns or struts, whereby a jig is prepared. Such a jig is so constituted that the frame may be moved vertically with respect to the surface of the roller stamper substrate 1 having thereon the photoresist coating, by adjusting or regulating the lengths of the four columns. When the exposure mask 3 is set to the above-mentioned frame of the jig and the four columns are appropriately adjusted, the exposure mask 3 may be fixed to the roller stamper substrate 1 substantially or directly in contact with the surface of the roller stamper substrate 1.

Figure 6:
FIGS. 6, 7A and 7B are schematic perspective or plan views for illustrating another embodiment of the stamper according to the present invention.

Further, as shown in FIG. 6, plural exposure masks can be fixed to the roller stamper substrate substantially or directly in contact with the stamper substrate.

After the exposure mask 2 is disposed on the roller stamper substrate 1 in the above-mentioned manner, the roller stamper substrate 1 is exposed to light.

Figure 8:
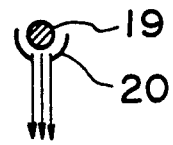
FIG. 8 is a schematic sectional view showing another embodiment of the exposure step usable in the present invention.

In the present invention, the roller stamper substrate 1 may be exposed to light at one shot by means of an exposure lamp by the medium of the exposure mask 3. Alternatively, as shown in FIG. 8, a cover 20 having a slit-like aperture may be disposed between the exposure mask 3 and a light source 19, and the resultant band-like exposure light may be supplied to the exposure mask 3. In such an embodiment, the roller stamper substrate 1 having thereon a photoresist coating 2 may preferably be rotated as shown in FIG. 8. Such an embodiment is advantageous in view of reduction in exposure irregularity, or formation of a uniform pattern.

In the embodiment as shown in FIG. 8, the exposure may be effected while the light source 19 and the cover 20 are moved with respect to the roller stamper substrate 1, e.g., while substantially retaining the distance between the light source 19 and the roller stamper substrate 1, but the roller stamper substrate 1 is not rotated. Further, all of these members 1, 19 and 20 can be moved so that the light source 19 and the cover 20 are moved in a direction counter to that of the movement of the roller stamper substrate 1. Such a method is particularly preferred when the roller stamper substrate 1 has a relatively small diameter.

After the above-mentioned exposure step, the roller stamper substrate 1 is subjected to development, whereby a predetermined pattern of the photoresist corresponding to that of the exposure mask 3 is formed on the roller stamper substrate 1. Then, the resultant roller stamper substrate 1 is subjected to etching.

In the present invention, either the dry etching process or the wet etching process may be used. In the etching step, the roller stamper substrate 1 may preferably be rotated in view of the prevention of etching irregularity. In the etching step, the roller stamper substrate 1 may preferably be rotated at a rotational speed of 10 rpm or larger, more preferably 30–120 rpm, most preferably 50–60 rpm. If the rotational speed is smaller than 10 rpm, irregularity in etching distribution due to discharge instability can occur in the dry etching. If the rotational speed is too large, vacuum leakage can undesirably occur.

In the etching step, e.g., the roller stamper substrate 1 having thereon the above-mentioned photoresist pattern may be set to a rotatable substrate holder (not shown), and then the roller stamper substrate 1 is dry-etched by using an etching gas such as Ar, $CF_4$ and $C_2F_6$, while the stamper substrate is rotated, so that a groove having a predetermined depth may be formed in the roller stamper substrate 1. The residual photoresist film remaining after the etching may be removed by using a photoresist remover, or by ashing using oxygen plasma.

In the above-mentioned embodiment, a roller stamper is prepared by using selective etching. In the present invention, however, the roller stamper may also be prepared by selectively (or patternwise) forming a pattern-forming layer on a stamper substrate on which a pattern of a photoresist has been formed, as shown in FIG. 3E, and removing the pattern of the photoresist as shown in FIG. 3F.

Figure 4:
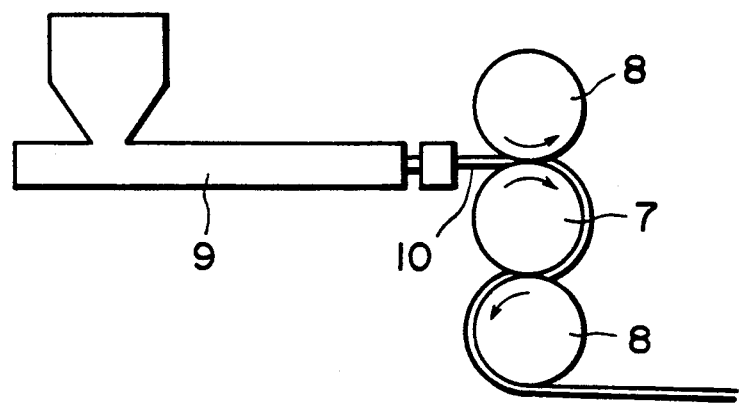
FIGS. 4 and 5 are schematic sectional views each showing a device for molding a data recording medium substrate.

In order to prepare a substrate for a data recording medium by using the roller stamper which has been prepared according to the present invention, various methods may be used. Specific examples thereof may include: one wherein a thermoplastic resin is softened by heating and then shaped by using the roller stamper; one wherein a melt-extruded resin is shaped by using the roller stamper before the hardening thereof, as shown in FIG. 4; one wherein an ultraviolet-curing (or hardening) resin is applied onto a substrate sheet 12 and shaped by using the roller stamper 7, and immediately thereafter, the resin is exposed to ultraviolet light to be hardened as shown in FIG. 5 (so-called "2P process"); etc.

Figure 5:
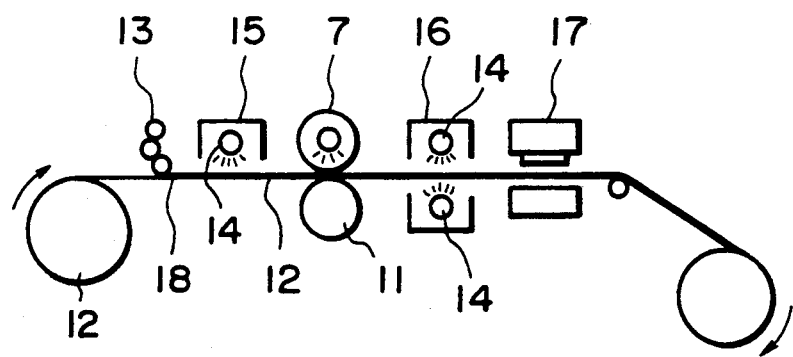

In the 2P process, when an ultraviolet lamp is disposed in the roller stamper 7 as shown in FIG. 5, the roller stamper substrate may preferably comprise a material capable of effectively transmitting ultraviolet light, such as quartz glass. The thus constituted roller stamper is advantageous in durability and light-transmissivity to the conventional roller stamper for the 2P process comprising a conventional roller stamper substrate and a thin electroformed stamper bonded thereto.

In the embodiment as shown in FIG. 5, the substrate sheet 12, as a data recording medium substrate, may preferably have a uniform thickness and comprise a material which shows little expansion or contraction, and little absorption to ultraviolet light. Specific examples of such a material may include polystyrene, triacetate, and polycarbonate.

Further, as shown in FIG. 6, plural exposure masks may be wound about a roller stamper substrate and then may be subjected to exposure and etching. In such a case, the productivity of the data recording medium substrate may further be enhanced.

In the present invention, the roller stamper substrate may also comprise a metal, a semiconductor, a dielectric, or an alloy. More specifically, there may be used a material capable of mirror grinding, such as Al, Si, glass, cemented carbide or a super hard alloy, and mold steel (e.g., Maraging steel).

In the present invention, it is also possible to form an unevenness pre-format pattern by forming a pattern-forming layer on a roller stamper substrate and then etching the pattern-forming layer selectively or patternwise. In such a case, it is possible that the roller stamper substrate for which surface precision and mechanical strength are required, and the pattern-forming layer for which transfer characteristics and durability are required, respectively comprise different materials. Accordingly, the material for each member may be selected from a wider scope of various materials. The pattern-forming layer may for example comprise Ni, TiN, $Si_3N_4$, CrN, TiC, SiC, WC, $Al_2O_3$, $ZrO_2$, etc. The pattern-forming layer may be formed on a roller stamper substrate by vacuum vapor deposition such as vacuum evaporation and sputtering. The pattern-forming layer may preferably have a thickness of 1–120 microns, more preferably 80–120 microns.

The shape (or form) or size of the unevenness pre-format pattern to be formed on the roller stamper according to the present invention may be appropriately selected. However, when the roller stamper is used for forming the substrate for an optical disk or optical card, which has a minute pre-format pattern comprising a tracking groove in the form of stripes, concentric circles or a spiral, having a depth of 0.01–0.4 micron, a width of 0.1–5.0 microns, and a pitch of 1–30 microns, the roller stamper according to the present invention may precisely provide a pattern corresponding to the above-mentioned minute pre-format portion on a roller stamper substrate.

In the present invention, the roller stamper substrate may preferably have a diameter of 50–1000 mm, more preferably 200–500 mm.

In the present invention, by use of the thus prepared roller stamper, a data recording medium substrate may be produced by means of an apparatus for producing the data recording medium substrate, as shown in FIGS. 4 and 5.

For example, FIG. 4 shows an extrusion molding apparatus. In FIG. 4, a sheet of resin 10 melt-extruded from an extruder 9 is sandwiched under pressure between a mirror roller 8 and the roller stamper 7 according to the present invention, whereby an unevenness pre-format pattern is transferred to a substrate sheet 10.

In FIG. 5, a substrate sheet 12 preliminarily wound into a roll-like form is pulled out and moved in the direction of an arrow shown in the figure. At a coating unit 13, an ultraviolet-curing resin 8 is applied onto the substrate sheet 12 and the resultant coating is pressed by a roller stamper 7 and exposed to light by means of an ultraviolet lamp 14 disposed at a curing unit, whereby a predetermined unevenness pre-format is transferred to the substrate sheet 12.

As described hereinabove, according to the process for producing a roller stamper according to the present invention, an unevenness pre-format pattern such a tracking groove is directly formed on a roller stamper substrate by using a flexible exposure mask, whereby the following remarkable effects may be achieved:

(1) An unevenness pre-format pattern for a data recording medium may be formed on the peripheral surface of a roller stamper substrate without using a laser beam exposure device.

(2) Since an unevenness pre-format pattern of a data recording medium such as a tracking groove may be formed on the peripheral surface of a roller stamper substrate by using a flexible exposure mask by contact exposure, economic characteristics and time efficiency are improved, whereby the cost of the data recording medium is reduced.

(3) In the prior art, an electroformed sheet-like stamper is bonded to a roller stamper substrate by using an adhesive to prepare a roller stamper. In the present invention, however, since the adhesive layer or joint portion used in the prior art may be omitted, a minute unevenness pre-format for a high-density data recording medium may more desirably be transferred to a data recording medium substrate.

Hereinbelow, the present invention will be described in more detail with reference to Examples.

EXAMPLE 1

Both sides of a 1 mm-thick quartz glass plate as a substrate for an exposure mask were ground by using cerium oxide to obtain a 0.2 mm-thick plate having flexibility. The resultant substrate had a flatness of below 3 microns and a surface roughness of below +25 Å. Then, a 900 Å-thick Ni film as a pattern-forming film was formed on the above-mentioned substrate by sputtering. Onto the Ni film, a photoresist (trade name: AZ-1300, mfd. by Hoechst Japan K.K.) was applied by spinner coating to form thereon a 1000 Å-thick photoresist layer.

Then, the above-mentioned substrate surface having the photoresist coating thereon was exposed to light by the medium of an exposure mask having a pattern in the form of stripes for a tracking groove for an optical card (groove width=9 microns, pitch=12 microns), and then subjected to development by using a developer liquid (trade name: AZ-312 MIF, mfd. by Hoechst Japan K.K.) at 20° C., for 30 sec. thereby to form a photoresist pattern corresponding to the pattern of the exposure mask, on the pattern-forming film.

The pattern-forming film from which the photoresist film had selectively been removed was subjected to wet etching by using 1000 ml of an etching liquid comprising 165 g of ammonium cerium nitrate, 42 ml of 70%-perchloric acid, and water) at 20° C. for 50 sec., so that the surface of the quartz glass was exposed. Thereafter, the resultant product was washed with water and dried, thereby to prepare a flexible exposure mask.

Separately, a 100 micron-thick electroless nickel plating was formed on the surface of a cylindrical member comprising tool steel (SKD 61, JIS) and having an outside diameter of 200 mm and a length of 50 cm, and then the resultant surface was ground to obtain a roller stamper substrate.

Onto the surface of the roller stamper substrate, a photoresist (trade name: AZ-1370, mfd. by Hoechst Japan K.K.) was applied by dipping to form thereon a 1.5 micron-thick photoresist layer, which was then subjected to pre-baking at 90° C. for 30 min. The exposure mask prepared above was caused to contact the photoresist coating and the mask was fixed to the coating by means of an adhesive tape (trade name: Kapton Tape, mfd. by 3M), and then the photoresist layer was exposed to ultraviolet light for 2 sec. corresponding to the pattern of the exposure mask by means of a simple exposure device (MA-10, mfd. by Mikasa K.K.).

Then, the resultant product was subjected to development by using a developer liquid (trade name: AZ-312 MIF, mfd. by Hoechst Japan K.K., stock solution: water=10:1) at 20° C. for 30–45 sec., thereby to form a photoresist pattern corresponding to the pattern of the exposure mask on the roller stamper substrate, and thereafter subjected to post-baking at 120° C. for 30 min. The resultant roller stamper substrate was subjected to etching in 10 wt. % phosphoric acid solution at 20° C. for 1 min. at a current density of 1 A/dm$^2$, while the roller stamper substrate was rotated at 60 rpm.

After the etching, the residual photoresist was removed by using a remover liquid (trade name: AZ-100, mfd. by Hoechst Japan K.K.) at 50° C., for 10 min. thereby to obtain a roller stamper having a pattern capable of providing grooves having a width of 9 microns, a depth of 0.3 micron and a pitch of 12 microns on the peripheral surface of the roller stamper substrate in the direction parallel to its circumferential direction (i.e., in the direction perpendicular to the rotation axis).

By using the thus obtained roller stamper, tracking grooves were transferred to a plate of polycarbonate (trade name: Panlite Sheet, mfd. by Teijin Kasei K.K.) extruded from an extruder, by a continuous groove-forming method using a roller. As a result, the groove pattern of the stamper was well transferred to the polycarbonate plate. When the depths of the resultant grooves were measured by means of a measurement device (Talysurf Type-6, mfd. by Rank Taylor Hobson K.K.), the depths were in the range of ±10% based on the height of the groove-forming pattern of the stamper.

EXAMPLE 2

A 2 micron-thick TiN film was formed on the surface of a cylindrical member comprising a super hard alloy having an outside diameter of 200 mm and a length of 50 cm by ion plating.

Onto the surface of the roller stamper substrate, a photoresist (trade name: AZ-1370, mfd. by Hoechst Japan K.K.) was applied to form thereon a photoresist layer having a thickness of 1.5–2.0 microns, which was then subjected to pre-baking at 90° C. for 30 min. The exposure mask prepared in Example 1 was caused to contact the photoresist coating and the mask was fixed to the coating by means of an adhesive tape (trade name: Kapton Tape, mfd. by 3M), and then the photoresist layer was exposed to ultraviolet light for 2 sec. at one shot corresponding to the pattern of the exposure mask by means of a simple exposure device.

Then, the resultant product was subjected to development by using a developer liquid (trade name: AZ-312 MIF, mfd. by Hoechst Japan K.K.) thereby to form a photoresist pattern corresponding to the pattern of the exposure mask, on the roller stamper substrate, and thereafter subjected to post-baking at 120° C., 30 min., whereby predetermined patterning was completed.

The roller stamper substrate having thereon the above-mentioned photoresist pattern was charged in a dry etching device equipped with a mechanism for rotating the roller stamper substrate at 20 rpm and with an ion gun for etching, and subjected to etching by using a reactive gas of $CF_4$ for 16 min. (gas flow rate: 60 sccm, vacuum: 7 Pa, RF discharge power: 140 W).

After the etching, the residual photoresist was removed by using a remover liquid (trade name: AZ-100, mfd. by Hoechst Japan K.K.) thereby to obtain a roller stamper having a pattern capable of providing grooves having a width of 9 microns, a depth of 0.3 micron and a pitch of 12 microns after transfer.

By using the thus obtained roller stamper, tracking grooves were transferred to a plate of polycarbonate (trade name: Panlite Sheet, mfd. by Teijin Kasei K.K.) extruded from an extruder, by a continuous groove-forming method using a roller. As a result, the groove pattern of the stamper was well transferred to the polycarbonate plate. When the depths of the resultant grooves were measured by means of a measurement device (Talysurf Type-6, mfd. by Rank Taylor Hobson K.K.), the depths were in the range of ±10% based on the depth of the groove of the stamper.

EXAMPLE 3

Both sides of a 1mm-thick quartz glass plate as a substrate for an exposure mask were ground by using cerium oxide to obtain a 0.1 mm-thick plate having flexibility. The resultant substrate had a flatness of +5 microns and a surface roughness of below ±20Å. Onto the substrate, a photoresist (trade name: AZ-1300, mfd. by Hoechst Japan K.K.) is applied by spinner coating to form thereon a 1000 Å-thick photoresist layer.

Then, the above-mentioned substrate surface having the photoresist coating thereon is exposed to light by the medium of an exposure mask having a pattern in the form of a spiral for a tracking groove for an optical disk (groove width=0.6 microns, groove pitch=1.6 microns), and then subjected to development by using a developer liquid (trade name: AZ-312 MIF, mfd. by Hoechst Japan K.K.) thereby to form a photoresist pattern corresponding to the pattern of the exposure mask, on the substrate.

Then, a 1000 Å-thick low-reflectivity Cr film was formed on the resultant surface of the quartz glass plate having thereon the above-mentioned photoresist pattern by sputtering, and thereafter the photoresist pattern was removed by using a remover as shown in FIGS. 3E and 3F, thereby to obtain a flexible exposure mask.

Onto the surface of a roller stamper substrate comprising quartz glass and having an outside diameter of 500 mm and a length of 1 m, a photoresist (trade name: AZ-1370, mfd. by Hoechst Japan K.K.) was applied to form thereon a 1.5 micron-thick photoresist layer, which was then subjected to pre-baking at 90° C. for 30 min. The flexible exposure mask prepared above was caused to contact the photoresist coating and the mask was fixed to the coating by means of an adhesive tape (trade name: Kapton Tape), and then the photoresist layer was uniformly exposed to ultraviolet light corresponding to the pattern of the exposure mask by means of a simple exposure device by the medium of a member having a 10 mm-wide slit, while the roller stamper substrate was rotated at 5 rpm.

Then, the resultant product was subjected to development by using a developer liquid (trade name: AZ-312 MIF, mfd. by Hoechst Japan K.K.) thereby to form a photoresist pattern corresponding to the pattern of the exposure mask, on the roller stamper substrate, and thereafter subjected to post-baking at 120° C., 30 min. The resultant roller stamper substrate was subjected to etching in a hydrofluoric acid ammonium fluoride (wt. ratio=1:7) solution at 20° C. for a period of time such that the height of the pattern became 0.1 micron, while the roller stamper substrate was rotated at 20 rpm.

After the etching, the residual photoresist was removed by using a remover liquid (trade name: AZ-100, mfd. by Hoechst Japan K.K.) thereby to obtain a roller stamper having a pre-format pattern capable of providing a spiral groove having a width of 0.6 microns, depth of 0.1 micron and a pitch of 1.6 microns on a data recording medium substrate.

By using the thus obtained roller stamper, tracking grooves were transferred to a substrate sheet 12, by means of an apparatus using a roller for the 2P process for forming a groove as shown in FIG. 5, whereby a data recording medium substrate was prepared.

More specifically, in this instance, a 0.3 mm-thick polycarbonate substrate sheet 12 was sent from a roll thereof, and at a coating unit 13, an ultraviolet-curing resin was applied onto the substrate sheet 12 by roller coating. At a pre-curing unit 15, the ultraviolet-curing resin was subjected to pre-curing as desired depending on the viscosity of the resin.

Then, a tracking groove was formed on the substrate sheet 12 by means of the roller stamper 7, and the resin was completely cured at a curing unit 16. Thereafter, the resultant substrate sheet 12 was punched at a punch unit 17 thereby to obtain a data recording medium substrate.

As described above, when a data recording medium substrate was prepared by using the roller stamper 7 by the 2P process, a tracking groove was formed on the substrate with a good transfer efficiency.

What is claimed is:

1. A process for producing a stamper in the form of a roller to be used for forming a predetermined pattern on a data recording medium substrate, said process comprising the steps of:
   forming a layer of a photoresist on a stamper substrate in the form of a roller;
   winding a flexible exposure mask, which includes a predetermined pattern, by affixing, to the roller stamper substrate having the photoresist layer thereon, and exposing the roller stamper substrate through the exposure mask to band-like exposure light, while moving the roller stamper substrate and the exposure mask relative to the band-like exposure light;
   subjecting the photoresist layer to development thereby to form on the stamper substrate a pattern of the photoresist corresponding to the pattern of the exposure mask; and
   forming on the stamper substrate an unevenness pattern corresponding to the pattern of the photoresist.

2. A process according to claim 1, wherein said pattern of the photoresist is formed on the stamper substrate and then the stamper substrate is subjected to etching, thereby to form an unevenness pattern on the stamper substrate.

3. A process according to claim 1, wherein said pattern of the photoresist is formed on the stamper substrate and then a film of a pattern-forming material is formed on the stamper substrate, thereby to form an unevenness pattern of the pattern-forming material on the stamper substrate.

4. A process according to claim 1, wherein the roller stamper substrate has a diameter of 50–1000 mm.

5. A process according to claim 4, wherein the roller stamper substrate has a diameter of 200–500 mm.

6. A process according to claim 1, further comprising exposing the roller stamper substrate having the photoresist layer thereon to light by the medium of a member having a slit.

7. A process according to claim 6, wherein said slit has a width of 2–20 mm.

8. A process according to claim 1, further comprising preparing the flexible exposure mask by forming a pattern-forming film on a flexible substrate, and pattern-wise etching the pattern-forming film.

9. A process according to claim 8, wherein said flexible substrate transmits ultraviolet light.

10. A process according to claim 8, wherein said flexible substrate of the exposure mask comprises quartz glass.

11. A process according to claim 8, wherein said flexible substrate of the exposure mask has a thickness of at most 0.5 mm.

12. A process according to claim 8, wherein said flexible substrate of the exposure mask has a thickness of 0.1–0.3 mm.

13. A process according to claim 8, wherein said pattern-forming film of the exposure mask has a thickness of 500–1200 Å.

* * * * *